(12) United States Patent
Park

(10) Patent No.: US 11,573,605 B2
(45) Date of Patent: Feb. 7, 2023

(54) DISPLAY MODULE AND METHOD OF MANUFACTURING THEREOF

(71) Applicant: Samsung Display Co., LTD., Yongin-si (KR)

(72) Inventor: Ju-young Park, Cheonan-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 245 days.

(21) Appl. No.: 17/023,650

(22) Filed: Sep. 17, 2020

(65) Prior Publication Data

US 2021/0191466 A1 Jun. 24, 2021

(30) Foreign Application Priority Data

Dec. 19, 2019 (KR) .......................... 10-2019-0170346

(51) Int. Cl.
| | |
|---|---|
| *H05K 1/18* | (2006.01) |
| *G06F 1/16* | (2006.01) |
| *H05K 1/02* | (2006.01) |
| *H05K 3/36* | (2006.01) |
| *G02F 1/1333* | (2006.01) |

(52) U.S. Cl.
CPC .......... *G06F 1/1652* (2013.01); *H05K 1/028* (2013.01); *H05K 1/189* (2013.01); *H05K 3/361* (2013.01); *G02F 1/133305* (2013.01); *G02F 1/133388* (2021.01); *H05K 2201/10128* (2013.01)

(58) Field of Classification Search
CPC ...... G06F 1/1652; H05K 1/028; H05K 1/189; H05K 3/361; H05K 2201/10128; G02F 1/133388; G02F 1/133305

USPC ......................................................... 361/749
See application file for complete search history.

(56) References Cited

U.S. PATENT DOCUMENTS

| | | | |
|---|---|---|---|
| 9,977,466 B2* | 5/2018 | Kwon | ................ H01L 51/0097 |
| 10,165,715 B2 | 12/2018 | Choi et al. | |
| 10,510,816 B2 | 12/2019 | Kim et al. | |
| 2018/0070455 A1 | 3/2018 | Lee et al. | |
| 2018/0081399 A1* | 3/2018 | Kwon | ....................... G09G 5/00 |
| 2018/0090698 A1* | 3/2018 | Jeong | ................... H01L 51/003 |
| 2019/0223289 A1* | 7/2019 | Kim | ...................... H05K 13/04 |
| 2019/0318689 A1 | 10/2019 | Kim | |
| 2020/0004077 A1* | 1/2020 | Lee | ..................... H01L 27/3232 |

FOREIGN PATENT DOCUMENTS

| | | |
|---|---|---|
| KR | 1020170104102 A | 9/2017 |
| KR | 1020180027665 A | 3/2018 |
| KR | 1020180032742 A | 4/2018 |
| KR | 1020180127606 A | 11/2018 |
| KR | 1020190119244 A | 10/2019 |

* cited by examiner

*Primary Examiner* — Binh B Tran
(74) *Attorney, Agent, or Firm* — Cantor Colburn LLP

(57) ABSTRACT

A manufacturing method of a display device includes providing a display panel including: a first area in which a plurality of pixels is arranged, a second area adjacent to the first area and at which the display panel is bendable, and a third area facing the first area with the second area therebetween; providing a circuit board electrically connected to the display panel at the third area; providing a first force to the third area of the display panel; and bending the second area of the display panel by the first force which is provided to the third area of the display panel.

16 Claims, 12 Drawing Sheets

DISPLAY MODULE AND METHOD OF MANUFACTURING THEREOF

This patent application claims priority to Korean Patent Application No. 10-2019-0170346, filed on Dec. 19, 2019, and all the benefits accruing therefrom under 35 U.S.C. § 119, the contents of which are hereby incorporated by reference in its entirety.

BACKGROUND

1. Field

The present disclosure relates to a display module having improved reliability and a method of manufacturing a display device including the display module.

2. Description of the Related Art

A display device displays a variety of images through a display screen, to provide a user with information. In general, the display device displays the information in a display screen allocated to the display device, and the display screen has an original size.

A flexible display device including a flexible display panel that is foldable, is being developed. Different from a rigid display device, the flexible display device is foldable, rollable or bendable. Since the shape of the flexible display device is changeable in various ways, the flexible display device may be transported regardless of an original size of the display screen, and thus, a user's convenience is improved.

SUMMARY

The present disclosure provides a display module having improved reliability.

The present disclosure provides a method of manufacturing a display device including the display module having improved reliability.

Embodiments of the invention provide a method of manufacturing a display device including providing a display panel including: a first area in which a plurality of pixels is arranged, a second area adjacent to the first area and at which the display panel is bendable, and a third area spaced apart from the first area with the second area therebetween; providing a circuit board electrically connected to the display panel at the third area; providing a first force to the third area of the display panel; and bending the second area of the display panel by the first force which is provided to the third area of the display panel.

The providing the display panel may include providing a driving element in the third area, the driving element spaced apart from the circuit board.

The third area of the display panel may include a peripheral area adjacent to the driving element and the circuit board, and the providing the first force to the third area may include: providing a plurality of vacuum members respectively corresponding to a plurality of locations in the peripheral area; and the plurality of vacuum members respectively providing a vacuum force as the first force, to the display panel, at the plurality of locations in the peripheral area.

The circuit board may include a driving element.

The third area of the display panel may include a peripheral area adjacent to the circuit board which has the driving element, and the providing the first force to the third area may include: providing a plurality of vacuum members respectively corresponding to a plurality of locations in the peripheral area; and the plurality of vacuum members respectively providing a vacuum force as the first force, to the display panel, at the plurality of locations in the peripheral area.

The providing the first force to the third area may include: providing a plurality of vacuum members corresponding to a plurality of locations in the third area, the plurality of vacuum members spaced apart from each other and from the circuit board; and the plurality of vacuum members respectively providing a vacuum force as the first force, to the display panel, at the plurality of locations in the third area.

The bending the second area may include moving the plurality of vacuum members together with the display panel to define a predetermined curvature of the second area.

The method may further include after the bending the second area of the display panel by the first force which is provided to the third area of the display panel, removing the first force from the third area.

The bending the second area may include deforming the display panel at the plurality of locations in the third area, to provide a plurality of protrusions of the display panel which respectively correspond to the plurality of locations.

The plurality of protrusions may each have a shape and the plurality of vacuum members may each have a shape, and the shape of the plurality of protrusions may respectively correspond to the shape of the plurality of vacuum members.

The method may further include providing a second force to the circuit board, the second force being different from the first force; and providing support to the circuit board by the second force which is provided thereto.

The providing the support to the circuit board and the bending of the second area, may be simultaneously performed.

The second force by which the support to the circuit board is provided, may be smaller than the first force by which the bending of the second area is provided.

Embodiments of the invention provide a display module which is deformable, including: a first area in which a plurality of pixels is arranged, a second area at which the display panel is bendable, and a third area; and a circuit board electrically connected to the display panel at the third area. In the third area: the display panel further includes a plurality of protrusions respectively defined by deformed portions of the display panel.

The display panel may further include in the third area, a driving element spaced apart from the circuit board.

The third area of the display panel may include a peripheral area adjacent to the driving element and the circuit board, and the plurality of protrusions in the peripheral area.

The circuit board may include a driving element.

The third area of the display panel may include: a peripheral area adjacent to the circuit board which has the driving element, and the plurality of protrusions in the peripheral area.

The display panel which is bent may dispose the first area facing the circuit board along a thickness direction of the display panel.

In a view along a thickness direction, each of the plurality of protrusions may have a circular shape.

According to one or more embodiment, the display panel includes in order: the first area in which the pixels are arranged, the second area which is bendable, and the third area to which a force is applied to bend the second area. Vacuum members provide a force to the third area during bending of the second area. That is, the force provided in bending the second area is not directly provided to external components which are connected to the display panel, for example, the circuit board. Therefore, separation of the circuit board from the display panel may be reduced or effectively prevented during the process of bending the second area. Thus, the display module having the improved reliability and the manufacturing method of the display device including the display module, may be provided.

BRIEF DESCRIPTION OF THE DRAWINGS

The above and other advantages of the present disclosure will become readily apparent by reference to the following detailed description when considered in conjunction with the accompanying drawings where.

DETAILED DESCRIPTION

Figure 1:
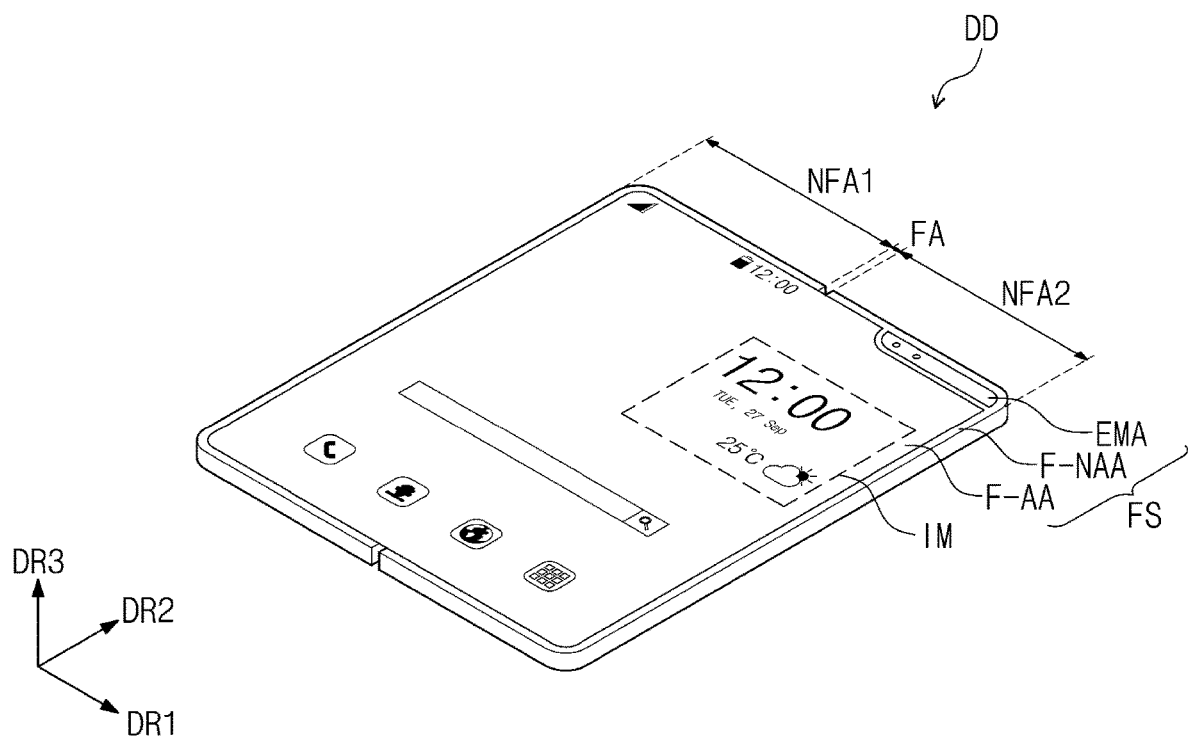
FIG. 1 is a perspective view showing an embodiment of a display device which is unfolded.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

In the present disclosure, it will be understood that when an element or layer is referred to as being related to another element such as being "on," "connected to" or "coupled to" another element or layer, it can be directly on, connected or coupled to the other element or layer or intervening elements or layers may be present. In contrast, when an element or layer is referred to as being related to another element such as being "directly on," "directly connected to" or "directly coupled to" another element or layer, no intervening elements or layers are present.

Like numerals refer to like elements throughout. In the drawings, the thickness, ratio, and dimension of components are exaggerated for effective description of the technical content.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

The terminology used herein is for the purpose of describing particular embodiments only and is not intended to be limiting. As used herein, the singular forms, "a", "an" and "the" are intended to include the plural forms as well, unless the context clearly indicates otherwise. For example, "an element" has the same meaning as "at least one element," unless the context clearly indicates otherwise. "At least one" is not to be construed as limiting "a" or "an." "Or" means "and/or." For example, "an element" has the same meaning as "at least one element," unless the context clearly indicates otherwise. "At least one" is not to be construed as limiting "a" or "an." "Or" means "and/or." As used herein, the term "and/or" may include any and all combinations of one or more of the associated listed items.

Spatially relative terms, such as "beneath," "below," "lower," "above," "upper" and the like, may be used herein for ease of description to describe one element or feature's relationship to another element(s) or feature(s) as illustrated in the figures.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "include" and/or "including," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, the present disclosure will be explained in detail with reference to the accompanying drawings.

FIG. 1 is a perspective view showing an embodiment of a display device DD.

Referring to FIG. 1, the display device DD may be a device that is activated, operated or controlled in response to an electrical signal. The display device DD may include various embodiments. In an embodiment, for example, the display device DD may include a tablet computer, a notebook computer, a computer, a smart television and the like. In the present embodiment, a smartphone will be described as a representative example of the display device DD.

The display device DD may display an image IM through a display surface FS. The display device DD which is flat or unfolded, disposes the display device DD, the display surface FS and various component thereof, in a plane which is substantially parallel to a plane defined by a first direction DR1 and a second direction DR2 which cross each other. The image IM may be displayed in a third direction DR3 (e.g., a viewing direction). The display surface FS through which the image IM is displayed may correspond to or define a front surface of the display device DD. The image IM may include a still image as well as a motion image. FIG. 1 shows a clock widget and application icons as a representative example of the image IM.

In the present embodiment, front (or upper) and rear (or lower) surfaces of each member of the display device DD may be defined with respect to a direction in which the image IM is displayed. The front and rear surfaces may face each other along the third direction DR3, and a normal line direction of each of the front and rear surfaces may be substantially parallel to the third direction DR3. The third direction DR3 may cross the first direction DR1 and the second direction DR2. A thickness direction of the display device DD and components thereof may be defined along the third direction DR3. The first, second, and third directions DR1, DR2 and DR3 may be substantially perpendicular to each other, without being limited thereto.

In addition, in the following descriptions, a surface defined by the first direction DR1 and the second direction DR2 crossing each other may be defined as a plane, and an expression "when viewed in a plane" or "in a top plan view" may mean a state of being viewed along the third direction DR3 and/or in a direction normal to the plane.

The display device DD may sense an external input applied thereto from outside the display device DD. The external input may include inputs of various forms provided from the outside of the display device DD. In an embodiment, for example, the external input may include external inputs in proximity to or approaching the display device DD at a predetermined distance, as well as a touch or contact input by an input tool such as a user's body part, e.g., a hand of a user, a pen, and the like. In addition, the external input may include various forms, such as a part of the user's body, light, heat or pressure.

The display surface FS may include an active area F-AA, a peripheral area F-NAA and an electronic module area EMA.

The active area F-AA and components thereof may be activated in response to the electrical signal. The image IM may be displayed in the active area F-AA, and various external inputs may be sensed at the active area F-AA. The active area F-AA may otherwise be referred to as a display area DA and/or an input-sensing area.

The peripheral area F-NAA may be defined adjacent to the active area F-AA. The peripheral area F-NAA may have a predetermined color. An image IM may not be displayed in the peripheral area F-NAA (e.g., a first non-display area). The peripheral area F-NAA may surround the active area F-AA in the top plan view. Accordingly, a shape of the active area F-AA may be substantially defined by the peripheral area F-NAA, however, this is merely exemplary. In an embodiment, the peripheral area F-NAA may be defined adjacent to only one side of the active area F-AA or may be omitted. The display device DD according to an embodiment of the present disclosure may include various configurations, and the display device DD should not be particularly limited.

Various electronic modules may be disposed in the electronic module area EMA. In an embodiment, for example, the electronic module may include at least one of a camera, a speaker, a light sensing sensor and a heat sensing sensor. The electronic module area EMA and/or components thereof may sense an external subject or external input through the display surface FS or may provide a sound signal, such as a voice, to the outside through the display surface FS. That is, the electronic module area EMA may receive an external input such as light, sound and pressure, and/or transmit such external input to outside the display device DD. In addition, the electronic module may include a plurality of components, however, it should not be limited to a particular embodiment.

An image IM may not be displayed in the electronic module area EMA (e.g., a second non-display area). The electronic module area EMA may be surrounded by the active area F-AA together with the peripheral area F-NAA, however, it should not be limited thereto or thereby. The electronic module area EMA may be defined in the active area F-AA, and the electronic module area EMA should not be particularly limited. In an embodiment, the active area F-AA may define a total planar area, and the electronic module area EMA may have or define a planar area within the total planar area of the active area F-AA. That is, the second non-display area (e.g., the electronic module area EMA) may be within the display area DA (e.g., active area F-AA).

The display device DD may include a folding area FA and a non-folding area. Referring to FIG. 1, the display device DD may include a folding area FA and a plurality of non-folding areas NFA1 and NFA2 each extending from the folding area FA. Various components of the display device DD may include a display area DA, a non-display area NDA, a folding area FA, a non-folding area, a folding axis, etc., which correspond to those elements described for the display device DD.

Figure 2:
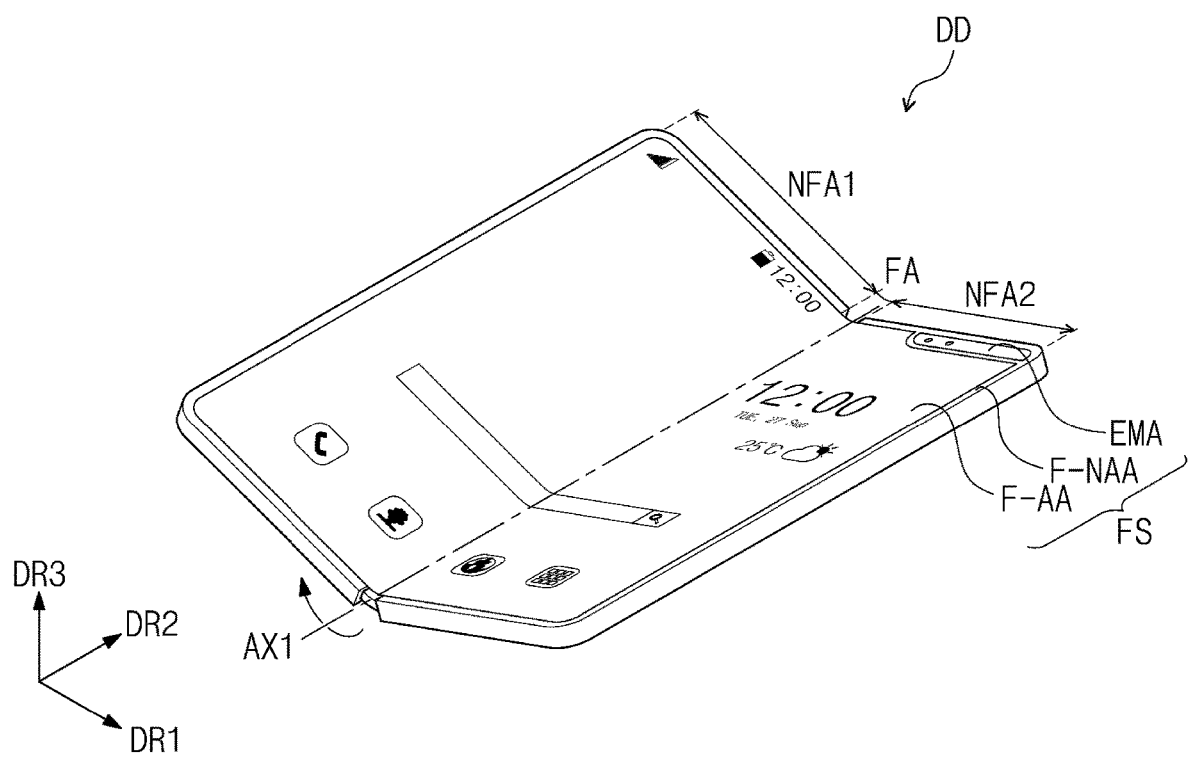
FIG. 2 is a perspective view showing an embodiment of a display device which is folded.

FIG. 2 is a perspective view showing an embodiment of the display device DD which is bendable or in-foldable.

Referring to FIG. 2, the display device DD may be foldable at the folding area FA, about a first folding axis AX1 that extends along the second direction DR2. The first folding axis AX1 may extend along the second direction DR2 on the display surface FS or within a plane defined by the display surface FS. In the present embodiment, the non-folding areas NFA1 and NFA2 may face each other with the folding area FA interposed therebetween. The non-folding areas NFA1 and NFA2 may respectively extend from opposing sides of the folding area FA, that is, in opposing directions from the folding area FA. The non-folding areas NFA1 and NFA2 may include a first non-folding area NFA1 and a second non-folding area NFA2. The first non-folding area NFA1 may extend from a first side of the folding area FA, and the second non-folding area NFA2 may extend from a second side of the folding area FA which is opposite to the first side thereof. In an embodiment, the display device DD may not be foldable at the first non-folding area NFA1 and the second non-folding area NFA2. In an embodiment, the first non-folding area NFA1 and the second non-folding area NFA2 may remain flat even when the display device DD is bent or folded.

The display device DD may be foldable about the first folding axis AX1 to be in-folded, where a portion of the display surface FS at the first non-folding area NFA1, faces a portion of the display surface FS at the second non-folding area NFA2.

Figure 3:
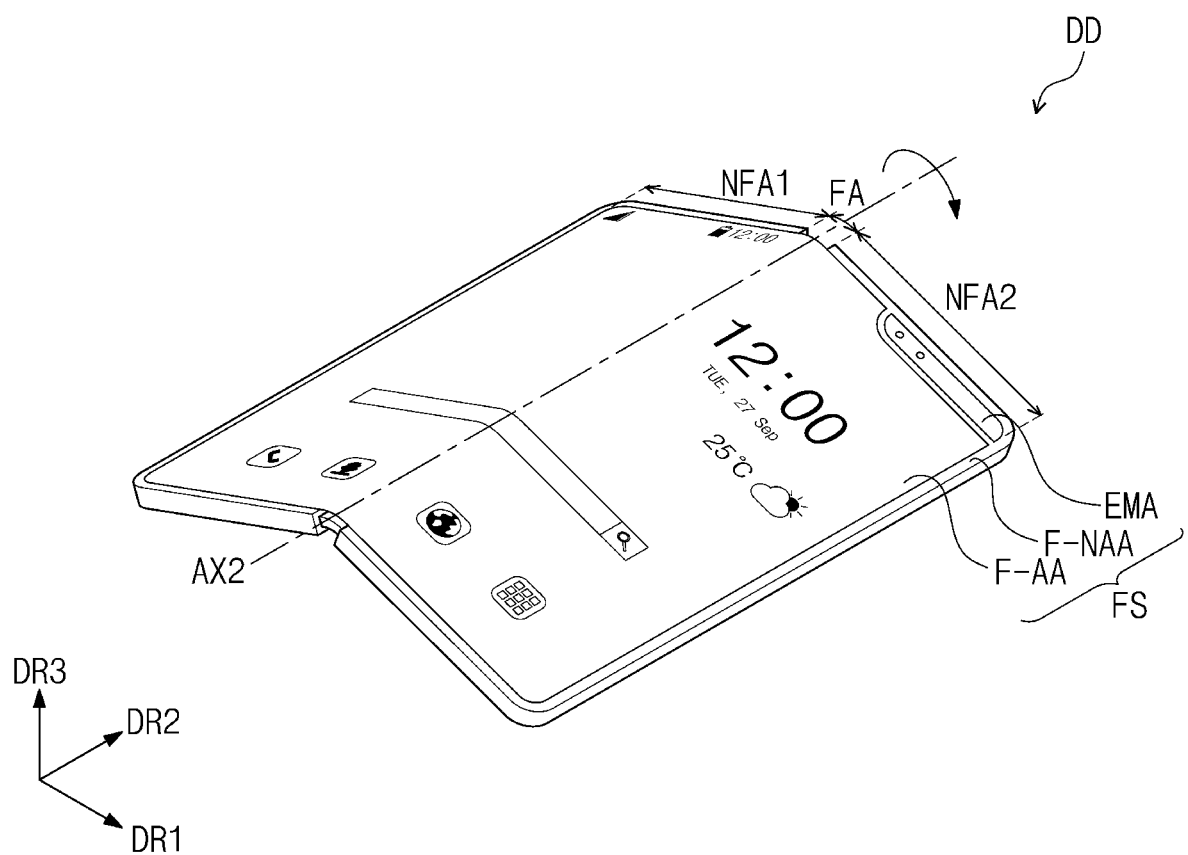
FIG. 3 is a perspective view showing an embodiment of a display device which is folded.

FIG. 3 is a perspective view showing an embodiment of the display device DD which is bendable or out-foldable.

Referring to FIG. 3, the display device DD may be foldable about a second folding axis AX2 that extends along the second direction DR2. The display device DD may be foldable about the second folding axis AX2 to be out-folded where a portion of a rear surface of the display device DD at the first non-folding area NFA1, faces a portion of the rear surface at the second non-folding area NFA2. In the display device DD which is out-folded, portions of the display surface FS face in opposite directions from each other.

Figure 4:
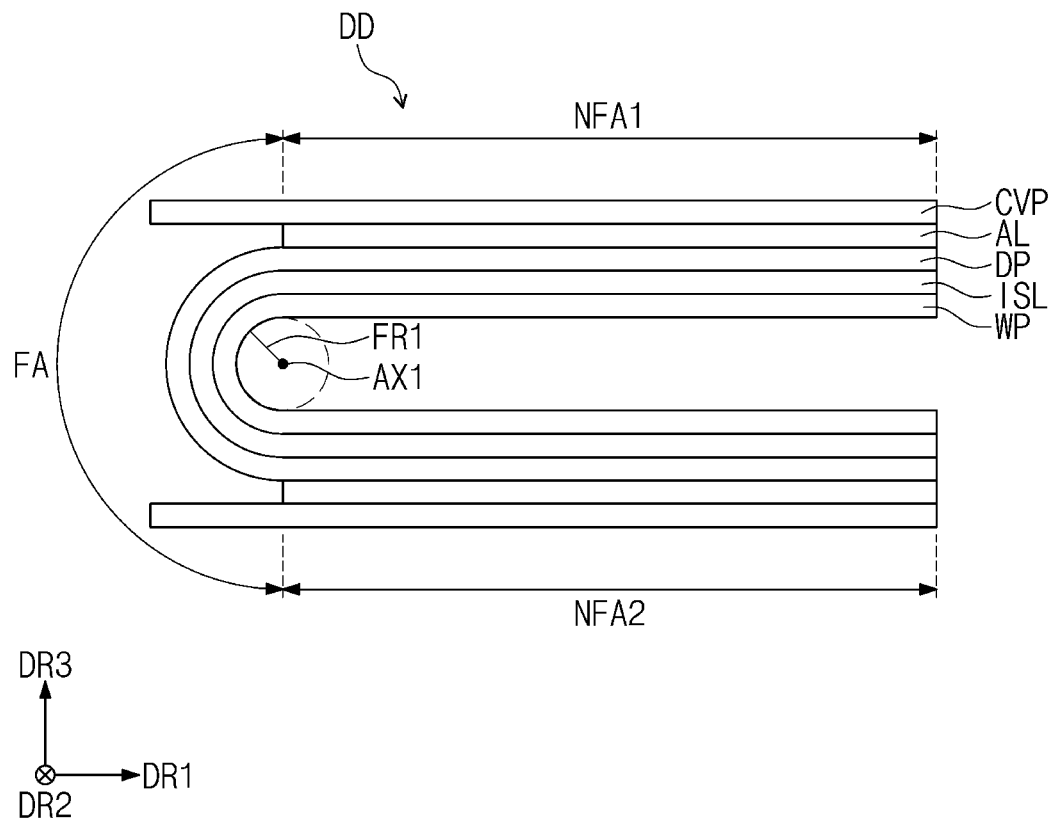
FIG. 4 is a cross-sectional view showing an embodiment of an end portion of a display device which is folded.

FIG. 4 is a cross-sectional view showing an embodiment of the display device DD which is bent or folded.

Referring to FIG. 4, the display device DD may include a window WP, an input sensor ISL (e.g., input sensing layer), a display panel DP, an adhesive layer AL, and a cover member CVP.

The window WP may include a glass or plastic material. The window WP may have a single-layer or multi-layer structure. In an embodiment, for example, the window WP may include a plurality of plastic films attached to each other such as by an adhesive, or a glass substrate and a plastic film which is attached to the glass substrate such as by an adhesive. An upper surface of the window WP may correspond to or define the display surface FS (refer to FIG. 1). That is, the window WP may define an outer surface of the display device DD, at a front side or viewing side thereof.

The display device DD which is flat or unfolded, may dispose the input sensor ISL under the window WP. The input sensor ISL may sense an external input through the window WP.

The display device DD which is flat or unfolded, may dispose the display panel DP under the input sensor ISL. The display panel DP may generate and/or display the image IM (refer to FIG. 1) which is transmittable through the window WP. The display panel DP may be a light-emitting type display panel, however, it should not be particularly limited. In an embodiment, for example, the display panel DP may be an organic light emitting display panel or a quantum dot light emitting display panel.

The display device DD which is flat or unfolded, may dispose the cover member CVP under the display panel DP. The cover member CVP may support a rear surface of the display panel DP and may protect the display panel DP.

The adhesive layer AL may be disposed between the display panel DP and the cover member CVP. The display panel DP and the cover member CVP may be coupled to each other by the adhesive layer AL. The adhesive layer AL may include an adhesive. In an embodiment, for example, the adhesive layer AL may include a pressure sensitive adhesive ("PSA"), an optically clear adhesive ("OCA") or an optically clear resin ("OCR").

When the display device DD is folded about the first folding axis AX1, the folding area FA of the display device DD may have a radius of curvature FR1. That is, the display device DD which is folded defines a radius of curvature FR1 at the folding area FA.

Figure 5:
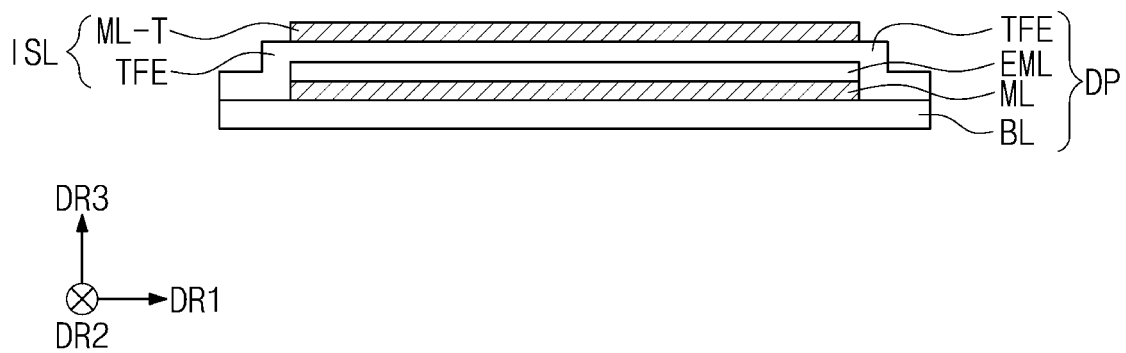
FIG. 5 is a cross-sectional view showing an embodiment of a display panel and an input sensor of a display device.

FIG. 5 is a cross-sectional view showing an embodiment of the display panel DP and the input sensor ISL.

Referring to FIG. 5, the display panel DP may include a first base layer BL, a display circuit layer ML, a display element layer EML, and a thin film encapsulation layer TFE as an encapsulation layer.

The first base layer BL may be a silicon substrate, a plastic substrate, an insulating film, or may have a stacked structure of a plurality of insulating layers.

The display circuit layer ML may be disposed on the first base layer BL. The display circuit layer ML may include a plurality of insulating layers, a plurality of conductive layers, and a semiconductor layer. The conductive layers may form signal lines or a pixel control circuit.

The display element layer EML may be disposed on the display circuit layer ML. The display element layer EML may be connected to the display circuit layer ML. The display element layer EML may generate a light or may control a transmittance of the light, under driving or control of the display circuit layer ML. In an embodiment, for example, a display element layer EML of the organic light emitting display panel may include an organic light emitting material. A display element layer EML of the quantum dot light emitting display panel may include at least one of a quantum dot and a quantum rod.

The thin film encapsulation layer TFE may be disposed on the display element layer EML. The thin film encapsulation layer TFE may form an outer surface of the display panel DP, without being limited thereto. The thin film encapsulation layer TFE may cover the display element layer EML. The thin film encapsulation layer TFE may include an organic layer and an inorganic layer, which are stacked on each other.

The input sensor ISL may include a second base layer TFE and a sensing circuit layer ML-T. The thin film encapsulation layer TFE and the second base layer TFE may be substantially the same component. That is, the thin film encapsulation layer TFE may define the second base layer TFE, and vice versa.

The sensing circuit layer ML-T may be disposed on the second base layer TFE. The sensing circuit layer ML-T may include a plurality of insulating layers and a plurality of conductive layers. The conductive layers may include a sensing electrode that senses the external input, a sensing line that is connected to the sensing electrode, and a sensing pad that is connected to the sensing line.

According to an embodiment of a method of manufacturing the display device DD, the display panel DP and the input sensor ISL may be provided or formed through successive processes. That is, the sensing circuit layer ML-T may be provided formed directly on the thin film encapsulation layer TFE.

Figure 6:
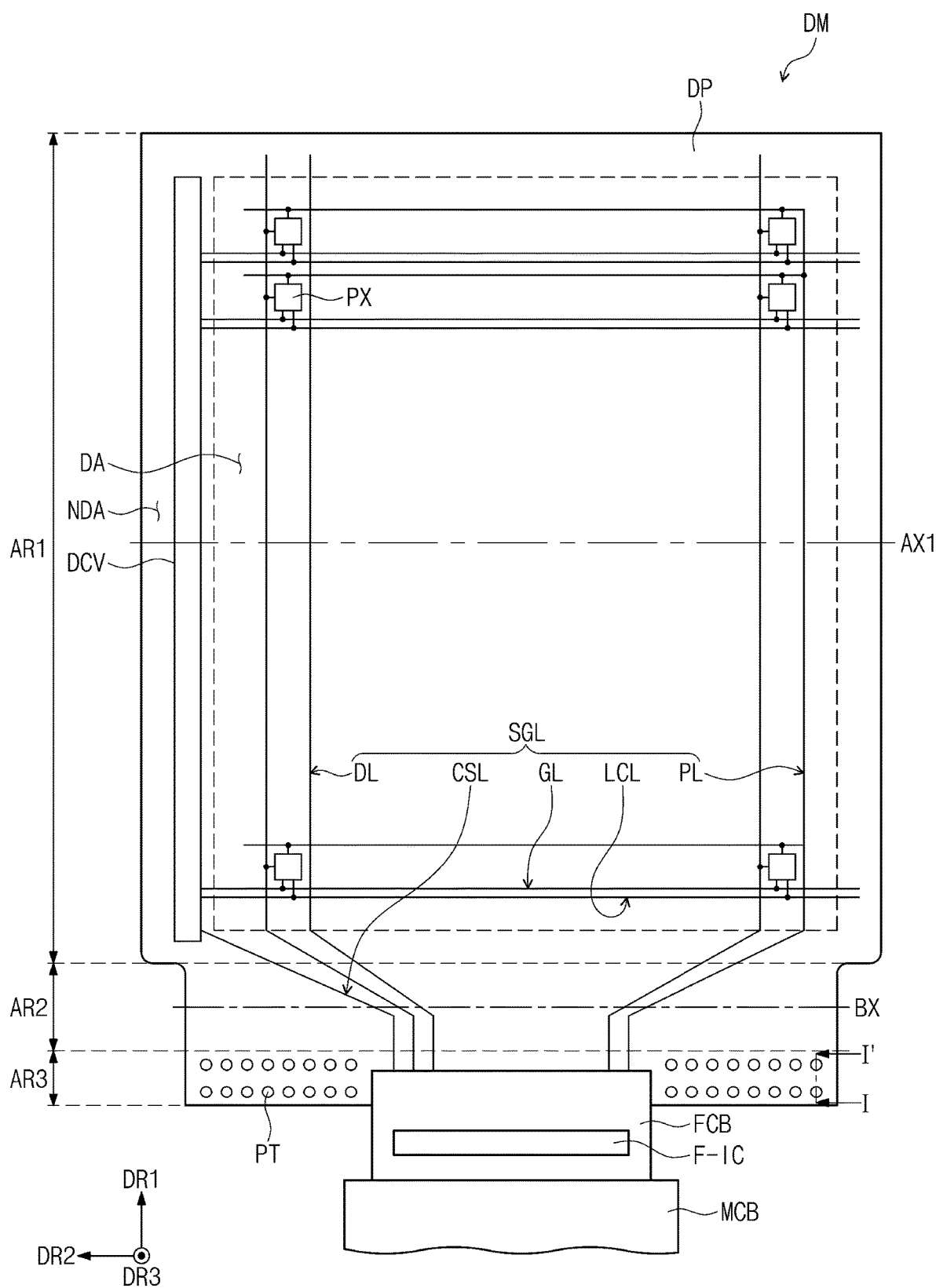
FIG. 6 is a top plan view showing an embodiment of a display module of a display device.
Figure 7:
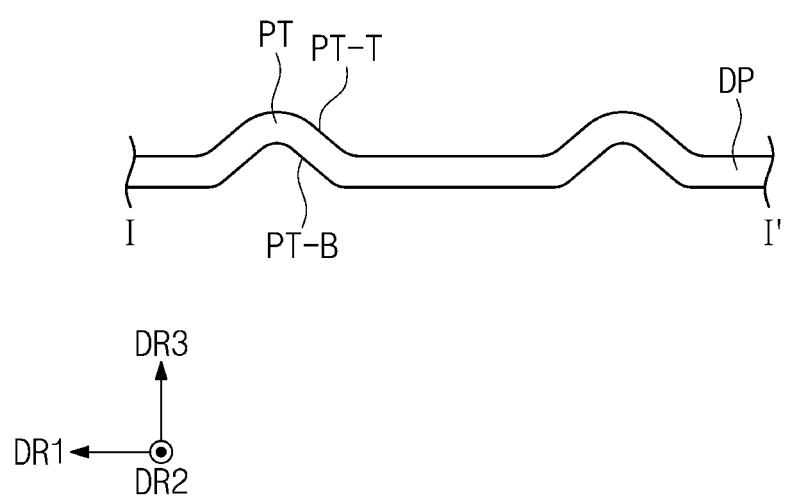
FIG. 7 is a cross-sectional view taken along line I-I' of FIG. 6.

FIG. 6 is a top plan view showing an embodiment of a display module DM, and FIG. 7 is a cross-sectional view of the display panel DP taken along line I-I' of FIG. 6.

Referring to FIGS. 6 and 7, the display module DM may include the display panel DP, a first circuit board MCB, a driving element F-IC and a second circuit board FCB. The first circuit board MCB and the second circuit board FCB may be collectively referred to as a circuit board.

The display panel DP may include a first area AR1, a second area AR2 and a third area AR3, arranged in order. A boundary may be formed between the first area AR1 and the second area AR2, and between the second area AR2 and the third area AR3.

The first area AR1 may include a display area DA (indicated with a dotted line in FIG. 6) and a non-display area NDA, which are defined therein. The display area DA may correspond to the active area F-AA (refer to FIG. 1).

The non-display area NDA may be defined adjacent to the display area DA and may surround the display area DA. The non-display area NDA may correspond to the peripheral area F-NAA (refer to FIG. 1). The display area DA may be an area at which the image IM (refer to FIG. 1) is displayed. A pixel PX provided in plurality (e.g., a plurality of pixels PX) may be arranged in the display area DA.

The first area AR1 may correspond to or overlap each of the folding area FA (refer to FIG. 1), the first non-folding area NFA1 (refer to FIG. 1) and the second non-folding area NFA2 (refer to FIG. 1), in the top plan view.

The display panel DP may include a scan driving circuit DCV, a signal line provided in plurality (e.g., a plurality of signal lines SGL), and the pixels PX.

The scan driving circuit DCV may be disposed in the non-display area NDA. The scan driving circuit DCV may generate an electrical signal such as scan signals. The scan driving circuit DCV may sequentially output the scan signals to one or more of a gate line GL. The scan driving circuit DCV may further output an electrical signal such as other control signals to a driving circuit of the pixels PX.

The scan driving circuit DCV in the non-display area NDA may include thin film transistors provided or formed through a same process as the driving circuit of the pixels PX. In an embodiment, for example, the same process may include a low temperature polycrystalline silicon ("LTPS") process or a low temperature polycrystalline oxide ("LTPO") process.

The signal lines SGL may include a conductive material. The signal lines SGL may include a metal material having flexibility to minimize damage of the display panel DP when the display panel DP is bent. In an embodiment, for example, each of the signal lines SGL may include a conductive material having relatively high flexibility, such as gold (Au), silver (Ag), aluminum (Al) or copper (Cu). However, the material for the signal lines SGL should not be limited thereto or thereby, and the signal lines SGL may be provided or formed of one of various materials used to manufacture the display device DD (refer to FIG. 1).

The signal lines SGL may include a data line DL provided in plurality (e.g., a plurality of data lines DL), a power line PL, a control signal line CSL, the gate line GL provided in plurality (e.g., a plurality of gate lines GL), and a light emitting control line LCL provided in plurality (e.g., a plurality of light emitting control lines LCL).

The data lines DL may be connected to corresponding pixels PX among the pixels PX, respectively. Each pixel PX may be connected to a corresponding data line among the data lines DL.

The power line PL may be connected to the pixels PX. The power line PL may supply an electrical signal such as a power to the pixels PX.

The control signal line CSL may be connected to the scan driving circuit DCV. The control signal line CSL may apply an electrical signal such as control signals to the scan driving circuit DCV.

The gate lines GL may extend along the second direction DR2. The gate lines GL may be connected to corresponding pixels PX among the pixels PX, respectively. The gate lines GL may be connected to the scan driving circuit DCV.

The light emitting control lines LCL may extend along the second direction DR2. The light emitting control lines LCL may be connected to corresponding pixels PX among the pixels PX, respectively. The light emitting control lines LCL may be connected to the scan driving circuit DCV.

A first portion of the data lines DL, the power line PL, the control signal line CSL, the gate lines GL, and the light emitting control lines LCL may be disposed in a same layer as each other, and a second portion of the data lines DL, the power line PL, the control signal line CSL, the gate lines GL, and the light emitting control lines LCL, which is different from the first portion, may be disposed in different layers from the first portion.

The second area AR2 may be adjacent to the first area AR1. The display module DM, the display panel DP and various component thereof may be bendable at the second area AR2 (e.g., bending area), about a bending axis BX. The bending axis BX may be substantially parallel to the second direction DR2. The first area AR1 and the third area AR3 may be spaced apart from each other along the first direction DR1, with the second area AR2 interposed therebetween.

The third area AR3 may be adjacent to the second area AR2. The first area AR1 and the third area AR3 may oppose each other, with the second area AR2 interposed therebetween. The display module DM, the display panel DP and various component thereof may not be bendable at the third area AR3 (e.g., non-bending area). In an embodiment, the third area AR3 may remain flat even when the display module DM is bent or folded.

An adsorption pattern PT provided in plurality (e.g., plurality of adsorption patterns PT) may be provided or formed in the third area AR3. The adsorption patterns PT may be arranged along the first direction DR1 and along the second direction DR2. Each of the adsorption patterns PT may be provided or formed at a peripheral region of the second circuit board FCB. The adsorption patterns PT may be spaced apart from an outer edge of the second circuit board FCB to not overlap the second circuit board FCB. Each of the adsorption patterns PT may have a circular shape (e.g., planar shape of a circle), however, this is merely exemplary. That is, in embodiments, the adsorption patterns PT may have a variety of planar shapes.

Referring to FIG. 7, each of the adsorption patterns PT may protrude in the third direction DR3, to provide protrusions of the display panel DP. Deformed portions of the display panel DP may define the protrusions (e.g., the adsorption patterns PT). The adsorption patterns PT may define concave portions and convex portions of the display panel DP which alternate along the first direction DR1 and/or the second direction DR2. The display panel DP may define a lower surface PT-B and an upper surface PT-T opposing each other along the third direction DR3. A portion of the lower surface PT-B defines a reference plane of the display panel DP. Each of the adsorption patterns PT may protrude in the third direction DR3, relative to the reference plane.

The upper surface PT-T and the lower surface PT-B of each of the adsorption patterns PT may have a curved shape in a cross-section, however, this is merely exemplary. A cross-sectional shape of the adsorption patterns PT should not be limited thereto or thereby. In an embodiment, for example, the upper surface PT-T of each of the adsorption patterns PT may have the curved shape in the cross-section, and the lower surface PT-B of each of the adsorption patterns PT may have a flat shape in the cross-section.

The first circuit board MCB may be a separate element from the display panel DP and electrically connected to the display panel DP. Although not shown separately, a plurality of passive elements and a plurality of active elements may be mounted on the first circuit board MCB. The first circuit board MCB may be a rigid circuit board or a flexible circuit board. An electrical signal from outside the display panel DP (e.g., from the first circuit board MCB) may be provided to the display panel DP.

The second circuit board FCB may connect the first circuit board MCB to the display panel DP. An electrical signal from outside the display panel DP may be transmitted through the second circuit board FCB to the display panel DP, and ultimately to the pixels PX. A portion of the second circuit board FCB may be disposed on or corresponding to the third area AR3. The second circuit board FCB may be electrically connected to the display panel DP through the signal lines SGL. In an embodiment, for example, the second circuit board FCB may be electrically connected to the display circuit layer ML (refer to FIG. 5) including the signal lines SGL. The second circuit board FCB may be a flexible circuit board.

The driving element F-IC may be mounted on the second circuit board FCB. The driving element F-IC may output electrical signals such as image signals and driving signals, which drive and/or control the pixels PX to display the image IM (refer to FIG. 1). The driving element F-IC may be electrically connected to conductive patterns arranged in an area of the second circuit board FCB. The image signals and the driving signals output from the driving element F-IC may be transmitted to the display panel DP through the second circuit board FCB.

One driving element F-IC is mounted on the second circuit board FCB shown in FIG. 6, however, the number of the driving element F-IC should not be limited thereto or thereby. A plurality of driving elements used to display the image IM (refer to FIG. 1) may be mounted on the second circuit board FCB.

Figure 8:
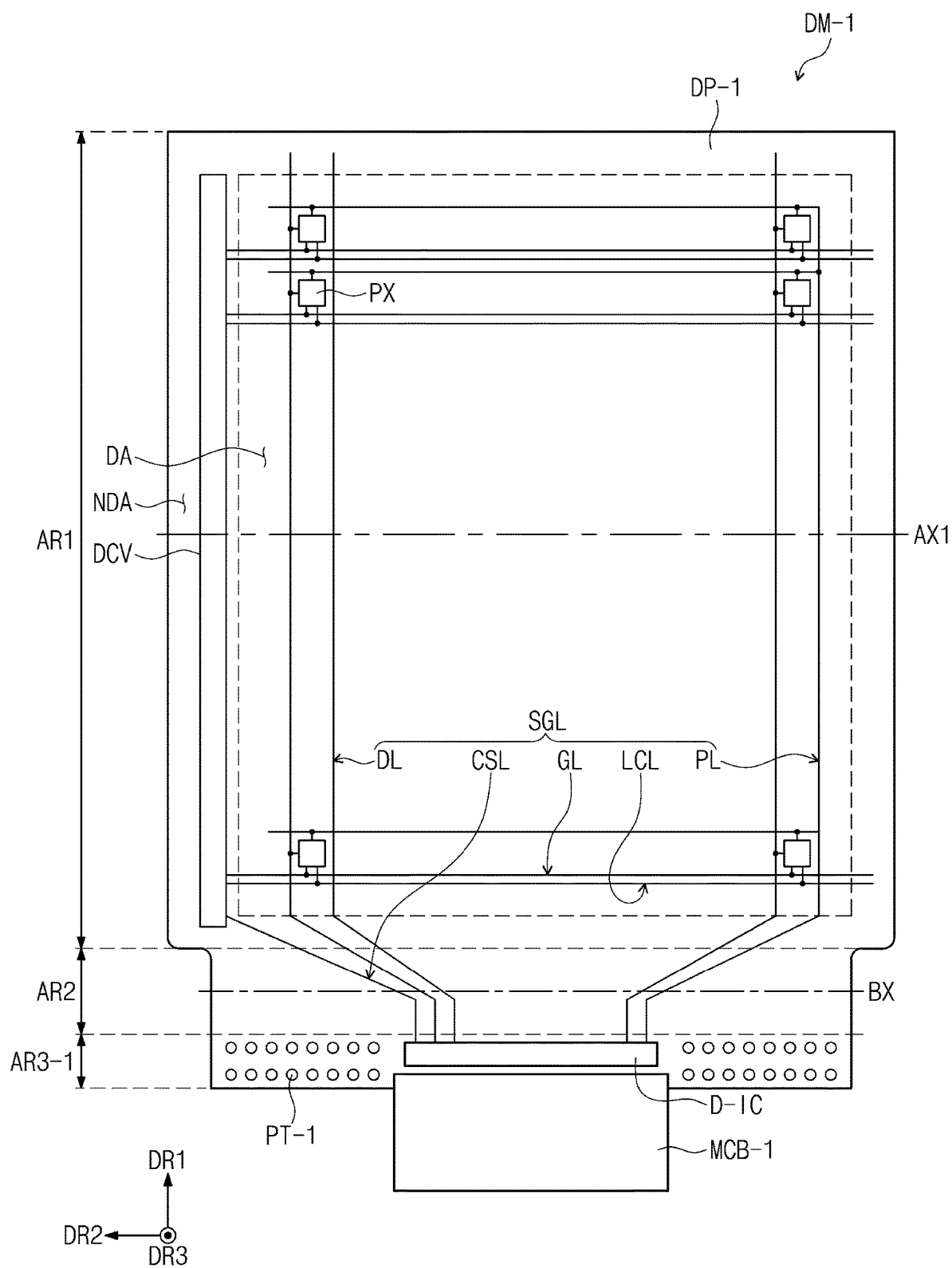
FIG. 8 is a plan view showing an embodiment of a display module of a display device.

FIG. 8 is a top plan view showing an embodiment of a display module DM-1. In FIG. 8, the same reference numerals denote the same elements in FIG. 6, and thus, detailed descriptions of the same elements will be omitted.

Referring to FIG. 8, the display module DM-1 may include a display panel DP-1, a driving element D-IC, and a first circuit board MCB-1.

The driving element D-IC may be mounted to the display panel DP-1 at a third area AR3-1 thereof. The driving element D-IC may output electrical signals such as image signals and driving signals, which are used by the pixels PX to display the image IM (refer to FIG. 1). The image signals and the driving signals output from the driving element D-IC may be transmitted to the display area DA of the display panel DP-1. One driving element D-IC is mounted on the display panel DP-1 shown in FIG. 8, however, the number of the driving element D-IC should not be limited thereto or thereby. A plurality of driving elements used by the pixels PX to display the image IM (refer to FIG. 1) may be mounted on the display panel DP-1.

The first circuit board MCB-1 may be electrically connected to the display panel DP-1. A portion of the first circuit board MCB-1 may be disposed corresponding to the third area AR3-1.

An adsorption pattern PT-1 provided in plurality (e.g., plurality of adsorption patterns PT-1) may be provided or formed in the third area AR3-1. The adsorption patterns PT-1 may be arranged along the first direction DR1 and along the second direction DR2. Each of the adsorption patterns PT-1 may be provided or formed at a peripheral area of the driving element D-IC. The adsorption patterns PT-1 may be spaced apart from an outer edge of the driving element D-IC to not overlap the driving element D-IC. The adsorption patterns PT-1 may have substantially the same configuration as the adsorption patterns PT (refer to FIG. 6).

Figure 9:
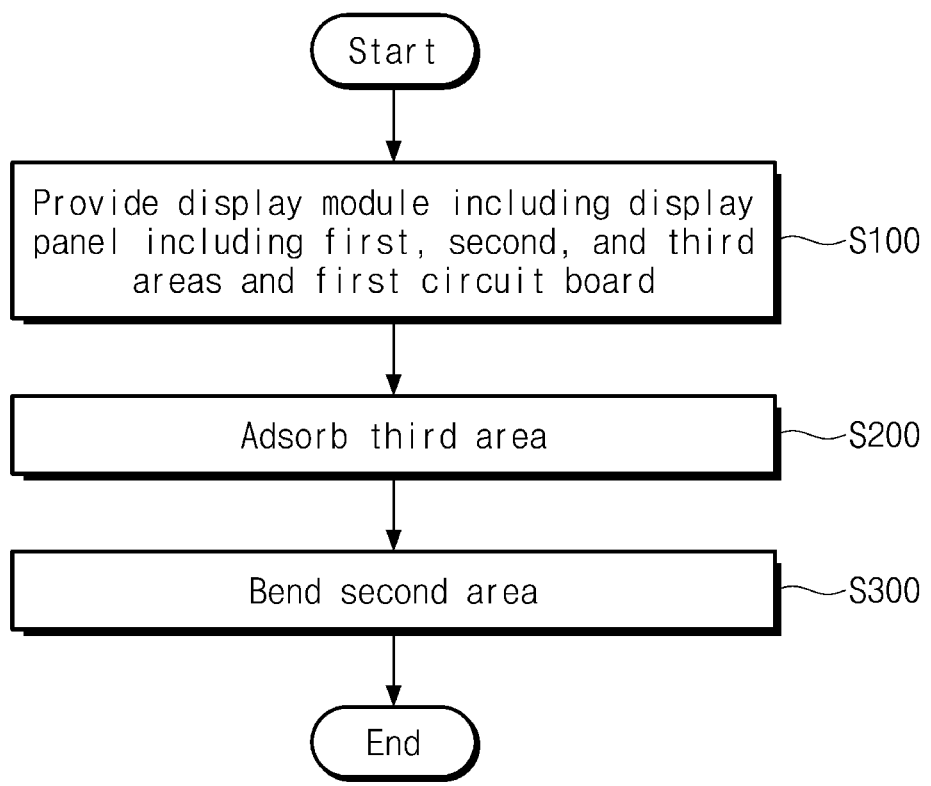
FIG. 9 is a flowchart showing an embodiment of a method of manufacturing a display device including a display module.
Figure 10:
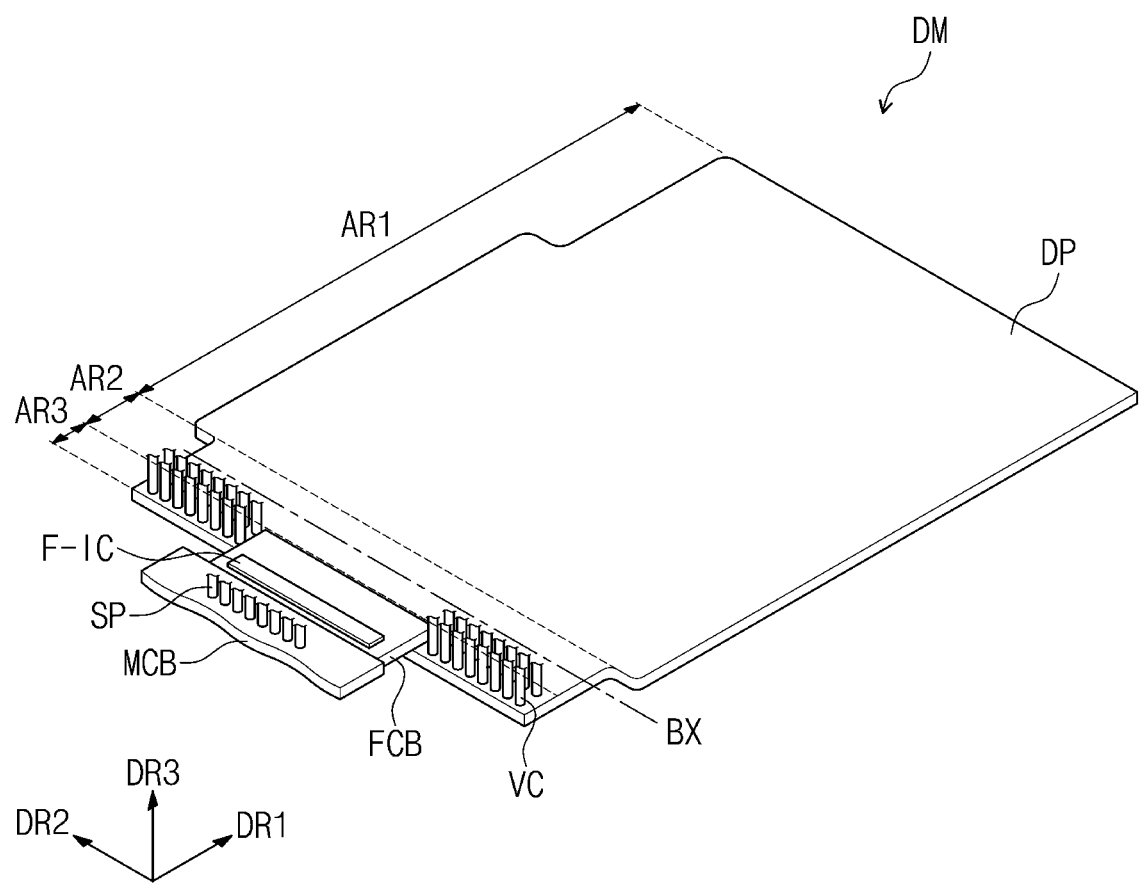
FIG. 10 is a perspective view showing an embodiment of a display module in a method of manufacturing.

FIG. 9 is a flowchart showing an embodiment of a method of manufacturing a display device DD, and FIG. 10 is a perspective view showing an embodiment of a display module DM.

Referring to FIGS. 9 and 10, the display module DM may include the display panel DP, the first circuit board MCB, the second circuit board FCB, and the driving element F-IC. The driving element F-IC may be mounted on the second circuit board FCB.

The display module DM including the first circuit board MCB and the display panel DP having the first area AR1, the second area AR2 and the third area AR3, may be provided (S100). In an embodiment, the display module DM which is flat may be disposed on a stage on which a bending process is performed to the display module DM. The stage may be a part of an apparatus or equipment (not shown) used in manufacturing the display module DM.

A force may be applied to the display module DM at the third area AR3 thereof (S200). In an embodiment, the force may be applied by an adsorption unit VC provided in plurality (e.g., a plurality of adsorption units VC). In an embodiment, for example, the third area AR3 may be fixed to the adsorption units VC by a force of vacuum-adsorption (e.g., vacuum force). The adsorption units VC which apply the vacuum force may also apply a bending force to the display panel DP at the third area AR3 thereof. The vacuum force and the bending force may be applied in different directions from each other, and may collectively define a "first force" applied to the display panel DP at the third area AR3 thereof. The adsorption units VC may be a part of an apparatus or equipment (not shown) used in manufacturing the display module DM. The adsorption unit VC may be otherwise referred to as a fixing member or vacuum member.

The adsorption units VC may be arranged along the first direction DR1 and along the second direction DR2, to correspond to the third area AR3. The adsorption units VC may be arranged along the first direction DR1 and along the second direction DR2, to correspond to positions of the adsorption patterns PT (refer to FIG. 6) provided in the third area AR3. The adsorption units VC may be arranged corresponding to a peripheral area of the second circuit board FCB. The adsorption units VC may be arranged corresponding to positions of the adsorption patterns PT (refer to FIG. 6) provided at a peripheral area of the second circuit board FCB. The display panel DP at the third area AR3 may be adsorbed (e.g., vacuum-fixed) by the adsorption unit VC.

A supporter SP provided in plurality (e.g., plurality of supporters SP) may be disposed corresponding to the first circuit board MCB of the display module DM which is flat. In an embodiment, a force may be applied to the display module DM at the first circuit board MCB thereof, by the supporters SP. The first circuit board MCB may be adsorbed by the supporters SP. In an embodiment, for example, the first circuit board MCB may be fixed to the supporters SP by a force of vacuum-adsorption. The supporters SP may be a part of an apparatus or equipment (not shown) used in manufacturing the display module DM.

Figure 11:
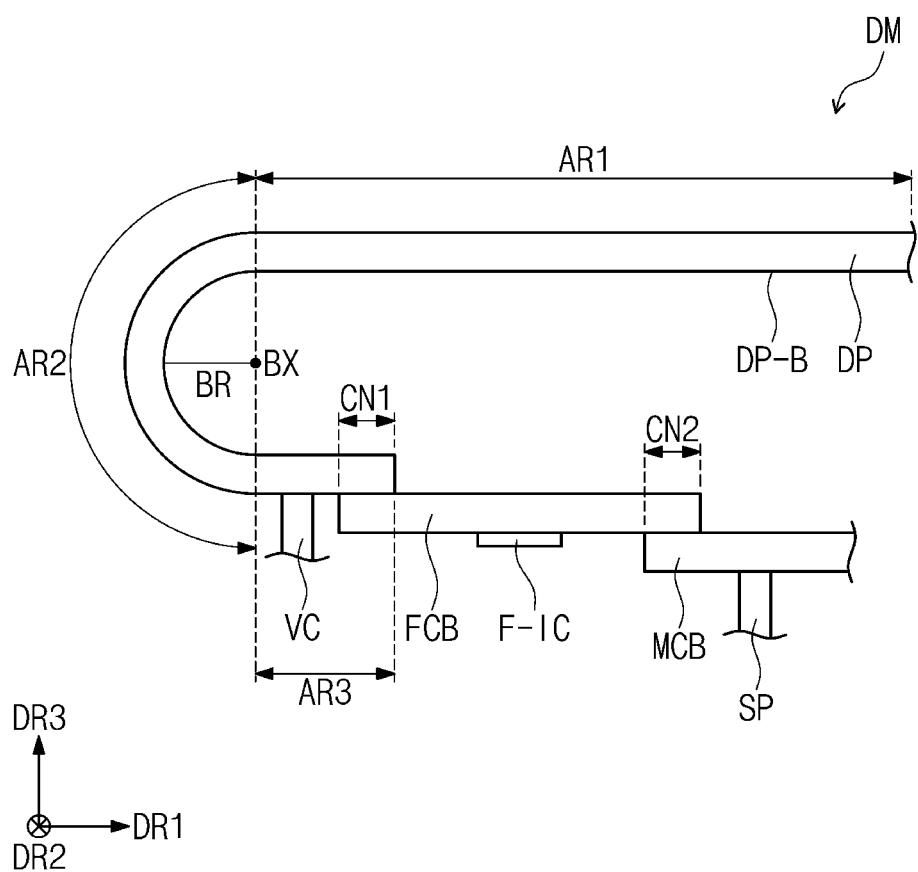
FIG. 11 is a cross-sectional view showing an embodiment of a display module which is bent in a method of manufacturing.

FIG. 11 is a cross-sectional view showing an embodiment of a display module DM which is bent.

Referring to FIGS. 9 and 11, together with FIG. 10, the display module DM may be bent at the second area AR2 (S300).

The display panel DP which is flat, may be bendable about the bending axis BX. The adsorption units VC which are adsorbed to the third area AR3 of the display panel DP, may apply the bending force to the display panel DP and move together with the display panel DP, to bend the display panel DP at the second area AR2 and define a predetermined curvature at the second area AR2. That is, the display module DM which is bent defines a curvature of the second area AR2.

In bending of the display panel DP by movement of the adsorption units VC together with the display panel DP, the supporters SP may support the first circuit board MCB and may move to allow the predetermined curvature to be formed at the second area AR2 under the bending force applied by the adsorption units VC. The supporters SP may fix a position of the first circuit board MCB so that first the circuit board MCB is not shaken in bending of the display panel DP. In an embodiment, providing support to the first circuit board MCB by a second force (e.g., vacuum force provided from the supporters SP), and bending of the second area AR2 by a first force (e.g., vacuum force plus bending force provided from the adsorption units VC as vacuum members), may be substantially simultaneously performed.

The display panel DP which is bent defines a radius of curvature BR of the second area AR2. The display module DM which is bent disposes the first area AR1 facing each of the third area AR3, second circuit board FCB and the first circuit board MCB along the thickness direction (e.g., the third direction DR3). In more detail, portions of a bottom surface DP-B of the display panel DP at the first area AR1, may face the first circuit board MCB along the third direction DR3. The display module DM which is bent disposes the second area AR2 at an end portion of the display module DM.

A second force (e.g., vacuum force) by which the first circuit board MCB is supported by the supporters SP may be smaller than a first force (e.g., vacuum force and/or bending force) by which the display panel DP is bent at the second area AR2 by the adsorption units VC. The supporters SP and the adsorption units VC may remain in contact with the display panel DP simultaneously with a bending force being applied to the display panel DP, and may each move together with the display panel DP during the bending thereof.

According to the present disclosure, the adsorption units VC that are used for bending the second area AR2 may be disposed corresponding to the third area AR3. The adsorption units VC may adsorb the third area AR3 of the display panel DP while a bending force is applied thereto, and thus, the second area AR2 of the display panel DP is bent. That is, the force used to bend the second area AR2 may not be applied directly to external components connected to the display panel DP, such as the first circuit board MCB or the second circuit board FCB.

A planar area (e.g., produced of dimensions in the first direction DR1 and the second direction DR2) at which the display panel DP and the second circuit board FCB are coupled to each other defines a first coupling area CN1, and a planar area at which the display panel DP and the first circuit board MCB are coupled to each other defines a second coupling area CN2.

In a conventional method of manufacturing a display module DM, the second area AR2 may be bent by adsorbing the first circuit board MCB or the second circuit board FCB, instead of adsorbing the third area AR3 as shown in FIGS. 10 and 11. In one or more embodiment of the invention, a force applied to the first coupling area CN1 in which the display panel DP and the second circuit board FCB are coupled to each other, and a force applied to the second coupling area CN2 in which the display panel DP and the first circuit board MCB are coupled to each other, may be smaller than a force applied when bending the second area AR2 by adsorbing the first circuit board MCB or the second circuit board FCB of the conventional method. Accordingly, a probability that the second circuit board FCB is separated from the display panel DP and a probability that the first circuit board MCB is separated from the second circuit board FCB during the bending process may be reduced. As a result, one or more embodiment of the manufacturing method of the display device DD (refer to FIG. 1) having the improved reliability, may be provided.

According to the present disclosure, when the display panel DP is bent, a portion to which the force for the bending is directly applied may be the third area AR3 where the adsorption units VC are disposed, and the force for the bending may not be applied directly to the first circuit board MCB. Since a force is not applied to the first circuit board MCB by the adsorption units VC, a shape of the first circuit board MCB may be provided in various ways without any limitation in space in which to arrange the adsorption units VC. Accordingly, the display panel DP may be bent using the adsorption units VC regardless of the shape of the first circuit board MCB. There is no restriction in designing the first circuit board MCB in the display device DD (refer to FIG. 1). Accordingly, the display device DD (refer to FIG. 1) having high degree of design freedom may be provided.

According to one or more embodiment of the display device DD (refer to FIG. 1), as the second circuit board FCB on which the driving element F-IC is mounted is disposed facing the bottom surface DP-B of the display panel DP (refer to FIG. 11), a narrow bezel may be implemented to minimize a non-display area NDA visible at a viewing side of the display device DD.

Figure 12:
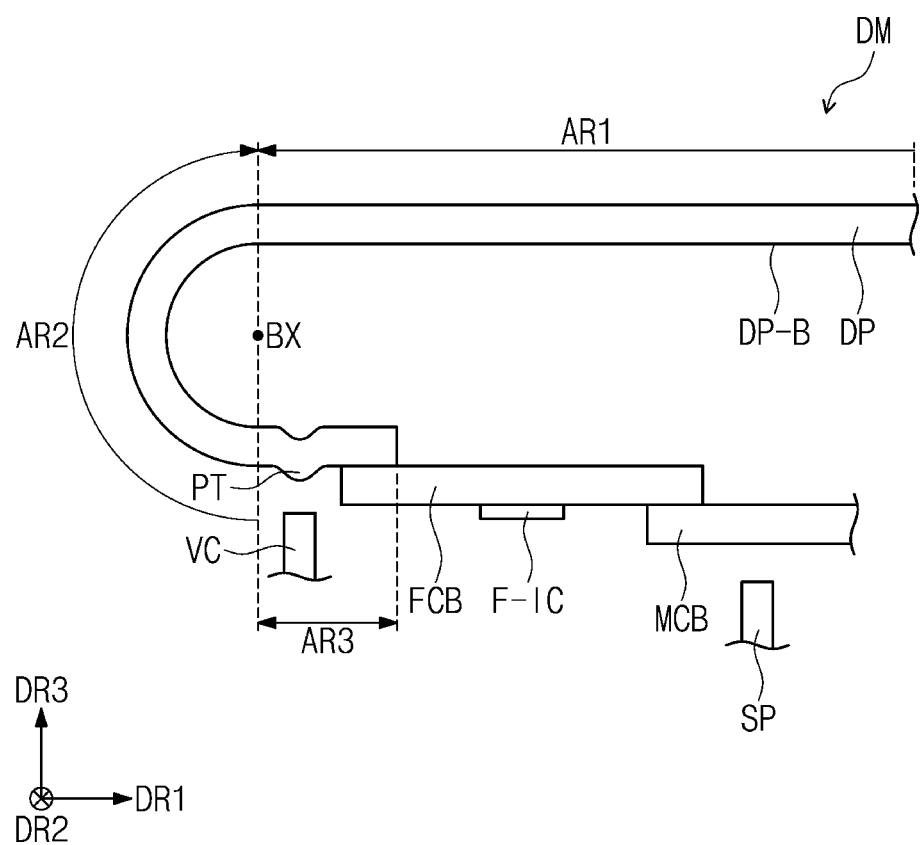
FIG. 12 is a cross-sectional view showing an embodiment of a display module which is bent in a method of manufacturing.

FIG. 12 is a cross-sectional view showing an embodiment of the display module DM which bent by a force applied from the adsorption units VC.

Referring to FIG. 12, the adsorption units VC may be separated from the third area AR3. The supporters SP may be separated from a first circuit board MCB. That is, the forces applied from the supporters SP and the adsorption units VC may be removed, and the supporters SP and the adsorption units VC may be detached from the display module DM. That is, the supporters SP and the adsorption units VC are removably attachable to the display module DM and components thereof.

The force applied from the supporters SP may not deform or minimally deform the first circuit board MCB. In contrast, the force applied from the adsorption units VC may deform the display module DM at the third area AR3. In detail, the force applied from the adsorption units VC may deform the display panel DP at positions in the third area AR3 which correspond to the adsorption units VC. The adsorption patterns PT protruding along the third direction DR3 may be provided formed in an area corresponding to an area in which the adsorption units VC are disposed.

Application of vacuum force by the adsorption units VC to the display panel DP, may deform the display panel DP towards the adsorption units VC. Each of the adsorption patterns PT may be provided in a shape corresponding to a shape of each of the adsorption units VC. The shapes may correspond in the top plan view (e.g., planar shapes as shown in FIGS. 6 and 8) and/or in the cross-sectional view (e.g., shapes as shown in FIG. 7).

Figure 13:
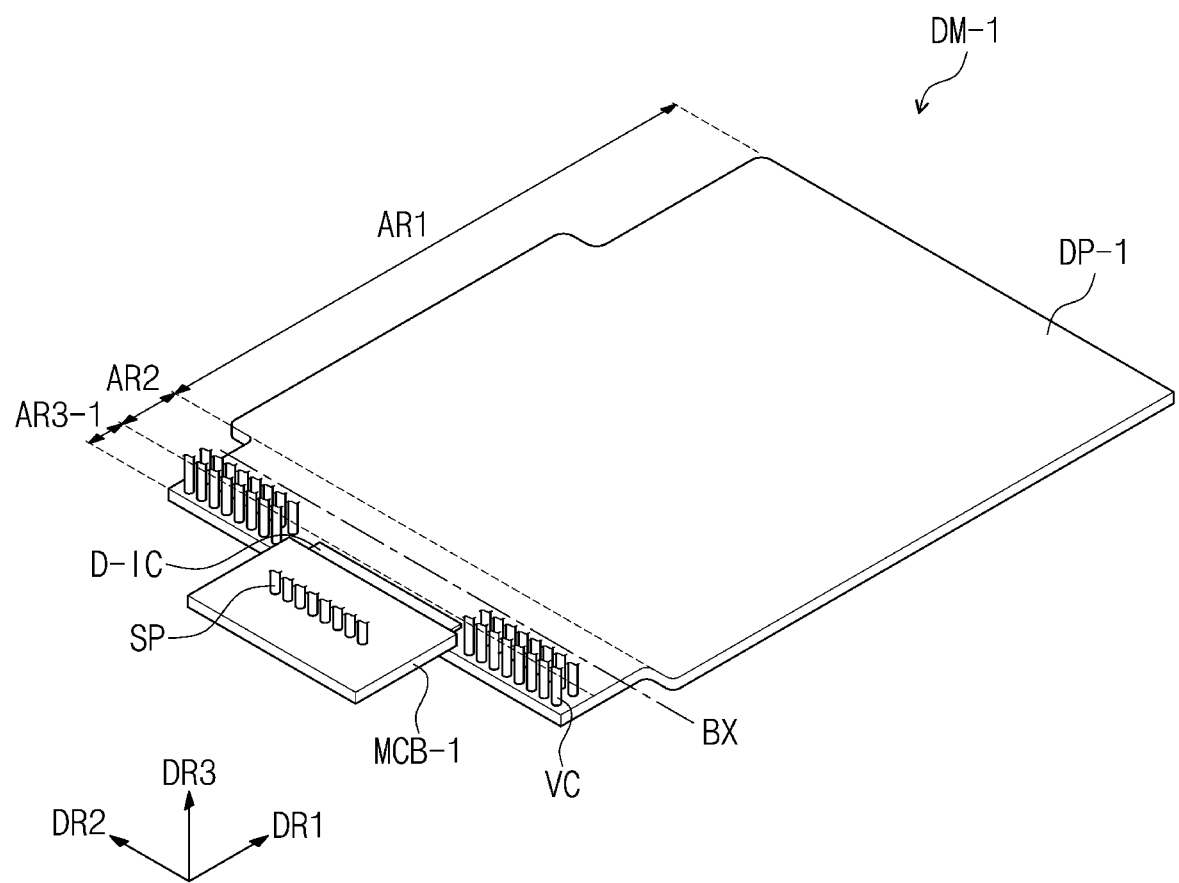
FIG. 13 is a perspective view showing an embodiment of a display module in a method of manufacturing.

FIG. 13 is a perspective view showing an embodiment of a display module DM-1 before bending at the second area AR2 thereof (refer to S100 and S200 in FIG. 9). In FIG. 13, the same reference numerals denote the same elements in FIG. 10, and thus, detailed descriptions of the same elements will be omitted.

Referring to FIGS. 9 and 13, the display module DM-1 may include a display panel DP-1, a first circuit board MCB, and a driving element D-IC. The display panel DP-1 may include the driving element D-IC at a third area AR3-1.

The display module DM-1 including the first circuit board MCB and the display panel DP-1 having the first area AR1, the second area AR2 and the third area AR3-1 may be provided on a stage on which a bending process is performed (refer to S100 discussed above). A force may be applied to the display module DM-1 at the third area AR3-1 thereof by a plurality of adsorption units VC (refer to S200 discussed above). In an embodiment, for example, the third area AR3-1 may be fixed to the adsorption units VC by a force of vacuum-adsorption (e.g., vacuum force).

The adsorption units VC may be arranged at a peripheral area of the driving element D-IC. The adsorption units VC fixed to the display panel DP-1 at the third area AR3 may be used to bend the display panel DP-1 at the second area AR2 about a bending axis BX (refer to S300 discussed above).

According to the present disclosure, the adsorption units VC that bend the second area AR2 may be disposed in the third area AR3-1. The adsorption units VC may adsorb the third area AR3-1 (e.g., be detachably coupled to and/or apply a vacuum force to) to bend the second area AR2. That is, in one or more embodiment, the force used to bend the second area AR2 may not be applied directly to the first circuit board MCB-1 connected to the display panel DP. A force applied to the second coupling area CN2 (refer to FIG. 11) in which the display panel DP-1 and the first circuit board MCB-1 are coupled to each other may be reduced compared to the force applied when bending the second area AR2 by adsorbing the first circuit board MCB-1 of a conventional method. Accordingly, a probability that the first circuit board MCB-1 is separated from the display panel DP during the bending process may be reduced. As a result, one or more embodiment of the manufacturing method of the display device DD (refer to FIG. 1) having the improved reliability may be provided.

Although embodiments of the present disclosure have been described, it is understood that the present disclosure should not be limited to these embodiments but various changes and modifications can be made by one ordinary skilled in the art within the spirit and scope of the present disclosure as hereinafter claimed. Therefore, the disclosed subject matter should not be limited to any single embodiment described herein, and the scope of the present invention shall be determined according to the attached claims.

What is claimed is:

1. A method of manufacturing a display module, comprising:
    providing a display panel comprising:
        a first area in which a plurality of pixels is arranged,
        a second area adjacent to the first area and at which the display panel is bendable, and
        a third area spaced apart from the first area with the second area therebetween;
    providing a circuit board electrically connected to the display panel at the third area;
    providing a first force to the third area of the display panel; and
    bending the second area of the display panel by the first force which is provided to the third area of the display panel,
    wherein the providing the display panel further comprises providing a driving element in the third area, the driving element spaced apart from the circuit board,
    wherein the third area of the display panel comprises a peripheral area adjacent to the driving element and the circuit board, and
    wherein the providing the first force to the third area comprises:
        providing a plurality of vacuum members respectively corresponding to a plurality of locations in the peripheral area; and
        the plurality of vacuum members respectively providing a vacuum force as the first force, to the display panel, at the plurality of locations in the peripheral area.

2. The method of claim 1, wherein the circuit board comprises a driving element.

3. The method of claim 2, wherein
    the third area of the display panel comprises a peripheral area adjacent to the circuit board which has the driving element, and
    the providing the first force to the third area comprises:
        providing a plurality of vacuum members respectively corresponding to a plurality of locations in the peripheral area; and
        the plurality of vacuum members respectively providing a vacuum force as the first force, to the display panel, at the plurality of locations in the peripheral area.

4. The method of claim 1, wherein the providing the first force to the third area comprises:
    providing a plurality of vacuum members corresponding to a plurality of locations in the third area, the plurality of vacuum members spaced apart from each other and from the circuit board; and
    the plurality of vacuum members respectively providing a vacuum force as the first force, to the display panel, at the plurality of locations in the third area.

5. The method of claim 4, wherein the bending the second area of the display panel by the first force which is provided to the third area of the display panel, comprises moving the plurality of vacuum members together with the display panel to define a predetermined curvature of the second area.

6. The method of claim 4, further comprising after the bending the second area of the display panel by the first force which is provided to the third area of the display panel, removing the first force from the third area.

7. The method of claim 6, wherein the bending the second area of the display panel by the first force which is provided to the third area of the display panel, comprises deforming the display panel at the plurality of locations in the third area, to provide a plurality of protrusions of the display panel which respectively correspond to the plurality of locations.

8. The method of claim 7, wherein
    the plurality of protrusions each has a shape and the plurality of vacuum members each has a shape, and
    the shape of the plurality of protrusions respectively corresponds to the shape of the plurality of vacuum members.

9. The method of claim 1, further comprising:
    providing a second force to the circuit board, the second force being different from the first force; and
    providing support to the circuit board by the second force which is provided thereto.

10. The method of claim 9, wherein the providing the support to the circuit board by the second force which is provided thereto, and the bending of the second area by the first force which is provided to the third area, are simultaneously performed.

11. The method of claim 10, wherein the second force by which the support to the circuit board is provided, is smaller than the first force by which the bending of the second area is provided.

12. A display module comprising:
- a display panel which is deformable, comprising:
  - a first area in which a plurality of pixels is arranged,
  - a second area at which the display panel is bendable, and
  - a third area; and
- a circuit board electrically connected to the display panel at the third area,
- wherein in the third area the display panel further comprises:
  - a plurality of protrusions respectively defined by deformed portions of the display panel, and
  - a driving element spaced apart from the circuit board, and
- wherein the third area of the display panel comprises:
  - a peripheral area adjacent to the driving element and the circuit board, and
  - the plurality of protrusions in the peripheral area.

13. The display module of claim 12, wherein the circuit board comprises a driving element.

14. The display module of claim 13, wherein the third area of the display panel comprises:
- a peripheral area adjacent to the circuit board which has the driving element, and
- the plurality of protrusions in the peripheral area.

15. The display module of claim 12, wherein the display panel which is bent disposes the first area facing the circuit board along a thickness direction of the display panel.

16. The display module of claim 12, wherein in a view along a thickness direction, each of the plurality of protrusions has a circular shape.

* * * * *